United States Patent [19]

Kim et al.

[11] Patent Number: 5,747,221
[45] Date of Patent: May 5, 1998

[54] PHOTOLITHOGRAPHY METHOD AND PHOTOLITHOGRAPHY SYSTEM FOR PERFORMING THE METHOD

[75] Inventors: Chong-hoe Kim, Kyoungki-do; Myŏng-gun Kil, Taejôn-jik'alshi; Won-t'aek Kwôn, Seoul; Kwang-chŏl Kim, Kyoungki-do, all of Rep. of Korea

[73] Assignee: Hyundai Electronics Industries Co., Ltd., Kyoungki-do, Rep. of Korea

[21] Appl. No.: 550,754

[22] Filed: Oct. 31, 1995

[30] Foreign Application Priority Data

Nov. 8, 1994 [KR] Rep. of Korea ............ 1994-29191
Nov. 8, 1994 [KR] Rep. of Korea ............ 1994-29192

[51] Int. Cl.$^6$ .................................................. G03F 7/20
[52] U.S. Cl. ................................. 430/311; 430/396
[58] Field of Search ......................... 430/5, 22, 311, 430/312, 396; 355/53

[56] References Cited

U.S. PATENT DOCUMENTS 3,615,466  10/1971  Sahni ........................................ 430/5
4,702,592  10/1987  Geiger ...................................... 355/53
5,206,515   4/1993  Elliott et al. ........................... 250/492.2

FOREIGN PATENT DOCUMENTS

4-355910  12/1992  Japan .
6-267822   9/1994  Japan .

*Primary Examiner*—Kathleen Duda
*Attorney, Agent, or Firm*—Wenderoth, Lind & Ponack

[57] ABSTRACT

A system and method for imaging a wafer in the producation of integrated circuits is disclosed. A plurality of reticles are used between a condenser lens and a projection lens to project integrated circuit mask pattern on a wafer. The transparent area of the mask patterns on the reticles, respectively, are different from each other in order to prevent the decrease of the resolution due to a change in the optical path while light passes through the reticles and the projection lens. Additionally, in at least one position between reticles, there is disposed at least one condenser lens to enhance both the straightness of light and the uniformity of exposure energy of the light.

5 Claims, 7 Drawing Sheets

PHOTOLITHOGRAPHY METHOD AND PHOTOLITHOGRAPHY SYSTEM FOR PERFORMING THE METHOD

BACKGROUND OF THE INVENTION

The invention generally relates to photolithography imaging. More particularly, this invention relates to a photolithography method and system for exposing a photoresist coated on a wafer to a fine device pattern on a mask or reticle by transferring the pattern onto the photoresist through an optical system including a plurality of reticles under a more uniform exposure energy.

Generally, in the field of semiconductor devices, conventional integrated circuit production utilizes photolithograhy techniques to project and transfer a predetermined pattern of the integrated circuit onto a wafer. These photolithography techniques were developed from photoresist masking techniques wherein the pattern on a mask is transferred onto a photoresist layer placed on the substrate by projecting an image of the mask onto the photoresist layer and developing it. The photolithographic process includes the exposure step in which the desired pattern is transferred into the photoresist coated on the substrate by projecting an image of the mask through a projection lens.

There are three main ways of exposing a photoresist: contact printing, proximity printing and projection printing. Various restrictions to employing these methods have arisen as integrated circuits have become smaller in size. Increasingly, the methods employed have required more sophistication in the alignment techniques and the resolution. Accordingly, current photolithograhy processes utilize an instrument which steps and repeats in a manner such that the wafer is properly aligned, then a portion of it is exposed to the desired image from the appropriate photomask, then the wafer is stepped and aligned, after which is again exposed to the appropriate photomask. This step and repeat alignment process utilizes a master image called a reticle. The reticle contains the integrated circuit pattern which is procured by forming an opaque layer on a transparent substrate. In other words, the reticle includes a transparent substrate such as glass, quartz, etc., and the opaque layer, such as chromium metal on the transparent substrate. The image of the reticle is focussed through a lens onto a portion of the wafer.

Figure 1:
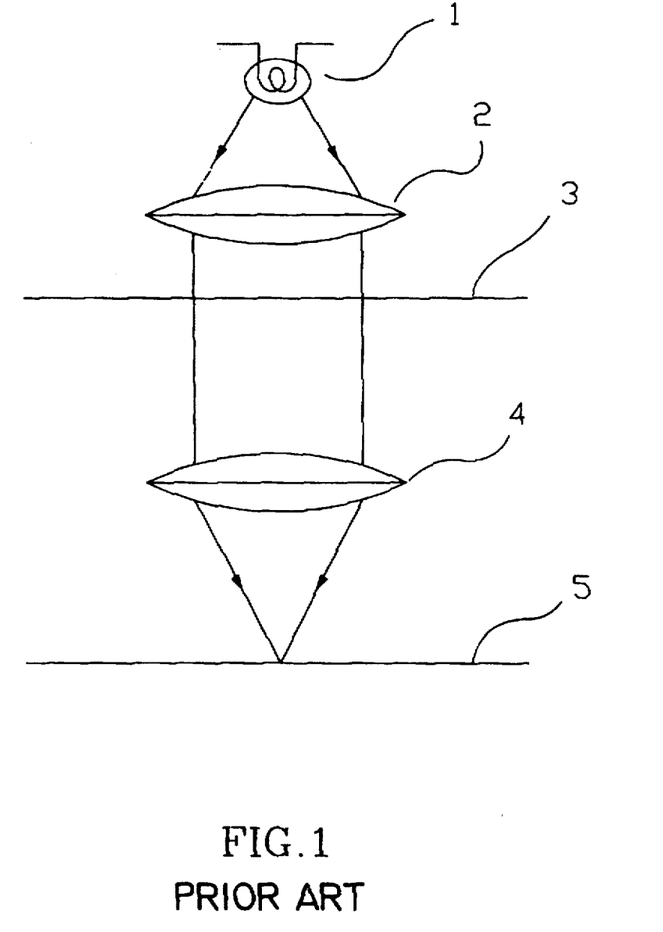
FIG. 1 shows a conventional system for performing the photolithography processes in the projection manner.

FIG. 1 shows the conventional system for performing the photolithography method in the projection manner.

As shown in FIG. 1, a reticle 3 that has an integrated circuit pattern is disposed between a condenser lens 2 and a projection lens 4. An illumination source 1 which projects light downwardly through the opening in aperture(not shown) is disposed above the condenser lens 2. Mercury lamps are a common source of exposing radiation. A wafer 5 covered with a photoresist layer is positioned below the projection lens 4.

Referring to the drawing, the process for imaging a wafer in the production of integrated circuits will be described. During the process, light from the illumination source 1 consisting of a mercury-vapor lamp is condensed through a condenser lens 2. The condensed light irradiates on the entire surface of the reticle 3. The reticle 3 has a predetermined pattern. A portion of the light irradiated on the reticle 3 is shielded by the opaque area on the reticle 3, but the other portion of the light is transmitted to the transparent area on the reticle 3. The light passing through the reticle 3 is imaged through the projection lens 4. The pattern is projected onto the wafer 5 such as a semiconductor wafer through a projection lens 4. Thus, an image of the pattern of the reticle 3 is produced on the wafer 5. The photoresist is removed selectively from the wafer 5 depending on the intensity of the light imaged thereon. The integrated circuit device pattern on the wafer is, thus formed.

However, in such a photolithography system and method, when light passes through the transparent area on the reticle positioned in a projection stepper apparatus, the light is scattered at the edge of the opaque layer on the reticle. Thus, the resolution is decreased.

In addition, in the conventional photolithography system and method, as the optical path of the light passing through the reticles and the projection lens deviates from the desired optical path, the projected pattern size becomes either larger or smaller than the predetermined pattern size, the resolution is decreased and the desired pattern is not obtained on the photoresist.

SUMMARY OF THE INVENTION

Therefore, one object of this invention is to provide a new photolithography method and system of enhancing the resolution using a plurality of reticles in a projection stepper apparatus by minimizing the scattering of the light at the edges of the opaque layers on the reticles while it passes through a plurality of reticles.

Another object of this invention is also to a photolithography method and system for improving an intensity and exposure energy of light and, thus, the resolution, by preventing an optical path during the passage of light through a plurality of reticles and a projection lens from being changed, using the reticles on which opaque areas differ from each other in their size.

Another object of this invention is still to provide a photolithography method and system for improving the resolution not only by minimizing the scattering of the light at the edges of transparent area of the mask patterns, but also by making the density of the light projected at the wafer more uniform, using a plurality of reticles and at least one lens disposed between the reticles.

BRIEF DESCRIPTION OF THE DRAWINGS

The above objects and other advantages of this invention will become more apparent by describing in detail the preferred embodiments of this invention with reference to the attached drawings in which.

DETAILED DESCRIPTION OF THE INVENTION

Figure 2:
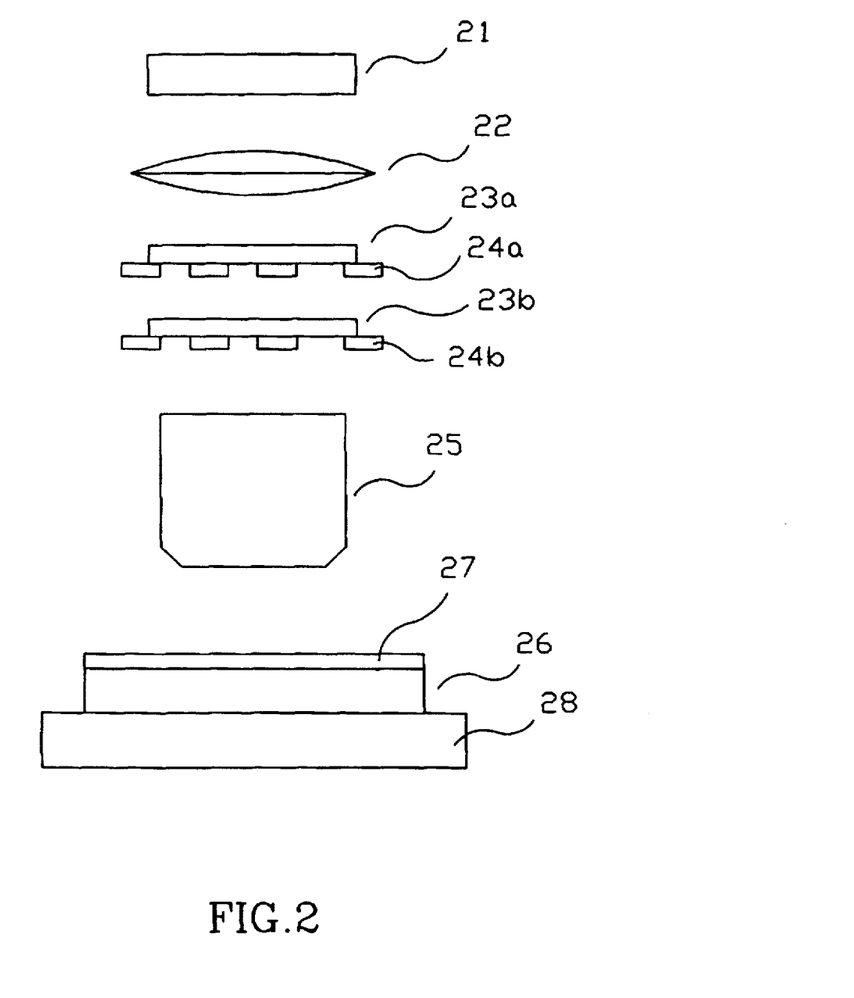
FIG. 2 is a drawing showing a schematical construction of a photolithography system for carrrying out a photolithography method according to an embodiment of the present invention.

FIG. 2 represents one embodiment of this invention. In the drawing, the schematical construction of a photolithography system for carrrying out a photolithography method is shown. There are many types of photolithography systems in many different configurations. The configuration used in FIG. 2 is shown for demonstrative purposes only. This invention is not to be limited to such a configuration. Referring to the drawing, the photolithography system is comprised of an illumination source 21, a plurality of reticles 23a and 23b, a projection lens 25, a wafer 26, a photoresist 27 overlying the wafer 26, and a wafer supporting means 28 for example, vacuum chuck. As shown in FIG. 2, a plurality of reticles 23a and 23b are positioned between the illumination source 25 and the projection lens 25. Even though the system shown in the drawing has two reticles 23a and 23b, the system may have three or more reticles, if necessary. As will be described below referring to FIG. 3, on the surface of each of reticles 23a and 23b is formed the integrated circuit pattern consisting of transparent areas 231 and 233 and opaque areas 232 and 234, respectively. The reticles 23a and 23b are supported by reticle supports 24a and 24b, respectively. The reticles 23a and 23b are maintained at the predetermined positions by inserting them into the system. The construction of each reticle is well known to those skilled in the art. Each of the reticle supports 24a and 24b corresponding to each reticle is set separately from each other along an optical path of the light from the illumination source 21. However, the reticle supports are not necessarily limited to the above structure. The reticle supports may be replaced by one support of an integral structure, provided that it separately includes all the reticles along an optical path.

Moreover, a projection lens 25 is provided along an optical path at the position next to the last reticle 23b of a plurality of the reticles 23a and 23b through which light lastly passes. The projection lens 25 is followed by a wafer 26 coated with photoresist 27 onto the surface of which the integrated circuit pattern on each reticle is to be transferred through the projection lens 25. Conventionally, an aperture 29 is positioned between the illumination source 21 and the condenser lens 22.

Accordingly, in carrying out the photolithography processes using the photolithography system according to this embodiment, the mask patterns of the same shape and size on the reticles 23a and 23b are reduced in size by the projection lens 25 and are projected and transferred onto the photoresist 27 overlying the wafer 26 in the step-and-repeat fashion. Following the above exposure step, the wafer 26 is subject to a developing process, and a desired integrated circuit pattern on the surface of the wafer 26 is formed.

In the photolithograpy system, the reticles 23a and 23b all have the same pattern shape and pattern size. Moreover, each of the reticles 23a and 23b includes the pattern of conventional structure in the art. In this embodiment, the integrated circuit pattern is comprised of a transparent substrate 231 or 233 such as glass, quartz, etc., and an opaque layer 232 or 234 such as chromium layer coated on the surface thereof.

Accordingly, in forming a pattern on a wafer using the photolithograhy system according to this embodiment, a plurality of reticles 23a and 23b each having an integrated circuit mask pattern are inserted into the photolithograhy system shown in FIG. 2. However, it is important in this embodiment to dispose the reticles separately from each other along the optical path. In the system shown in FIG. 2, the conventional reticle supports in the prior art photolithography system were altered to support a plurality of reticles at each of separate positions with the reticle supports being separate from each other. Accordingly, as a plurality of reticles are disposed at a plurality of separate positions in the photolithograpy system in the overlapping manner along the optical path as described above, a fine pattern with a high resolution can be formed on the photoresist coated on the wafer.

Figure 3:
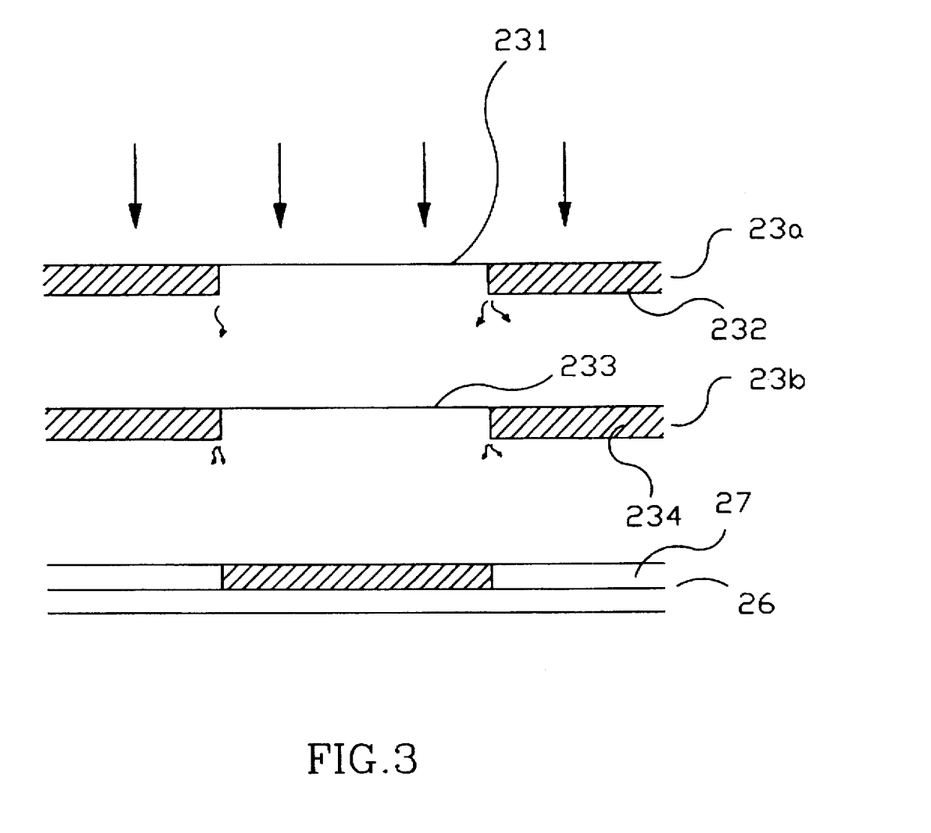
FIG. 3 is a drawing which shows a state of light while light from the illumination source passes through a plurality of reticles.
Figure 4:
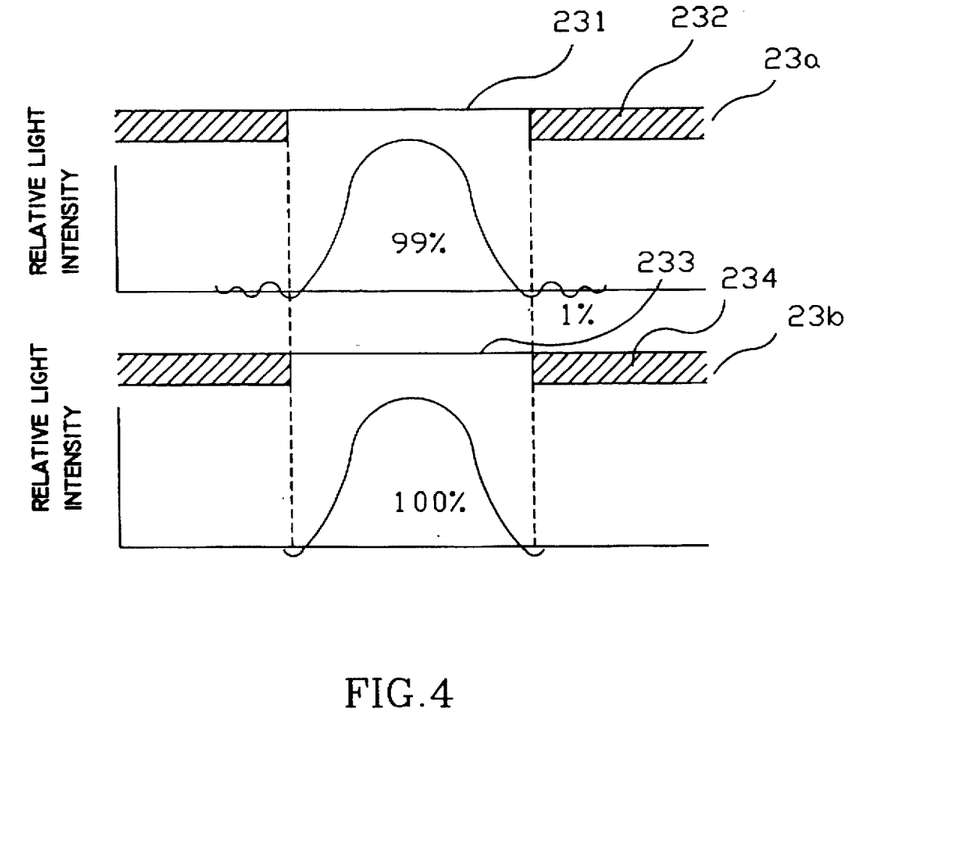
FIG. 4 is a schematical view showing the distribution state of energy intensity of light while light irradiated from the illumination source passes through a plurality of reticles so as to carry out a photolithography method according to one embodiment of this invention.

The above embodiment is capable of transferring the pattern in uniform width and size onto the photoresist by obtaining uniform projected light of high resolution using a plurality of reticles will be further understood by descriptions of FIGS. 3 and 4.

FIG. 3 is a drawing which shows a state of light when light from an illumination source passes through a plurality of reticles.

FIG. 4 is a schematical view showing the distribution state of energy intensity of light when light passes through a plurality of reticles by irradiating the light so as to carry out a photolithography method according to one embodiment of this invention.

Referring to FIG. 3, the reticles 23a and 23b, which are identical in their shape and size, are disposed separately from each other in the system at their positions. When light passes through the first reticle 23a, the light is somewhat scattered, as indicated by the arrows, at the edges of transparent area 231 of the integrated circuit pattern on the reticle 23a. The scattered portion of the light is nearly filtered out when the light transmitted through the first reticle 23a, passes through the second reticle 23b.

Even though there again occurs scattering of the light at the edges of opaque area 234 of the integrated circuit pattern on the second reticle 23b, a higher resolution is obtained. This is because the intensity of the scattered portion of the light at the edges of the opaque area of the integrated circuit pattern on the second reticle 23b is so weak that it does not effect the pattern of the surface of photoresist overlying the wafer. The pattern with a higher uniformity and fineness is thus capable of being projected onto the photoresist. If three reticles or more are used in the system, the resolution will be enhanced even further based on the above-described principle.

Accordingly, although the system in the drawings has two reticles only, it is evident to those skilled in the art that the system for carrying out the photolithography method according to this invention may include three or more reticles.

The principle illustrated in FIG. 3 will be further described with reference to FIG. 4, which shows the energy distribution of the light while it passes through a plurality of reticles.

When the light emitted from the illumination source 21 passes through the first reticle 23a, about 99% of the emitted light passes through the first reticle 23a while about 1% or less of the emitted light is scattered at interfaces between the transparent area 231 and the opaque area, i.e., the chromium pattern 232, of the pattern. The scattered portion of light is nearly filtered out when the light passes through the second reticle. Although the light is again scattered at edges of the opaque area 232 while passing through the second reticle 23b, such scattered portion of light is low enough in its intensity not to have an effect on the uniformity and fineness of the photoresist coated on the wafer. Hence, a desired pattern with a high selectivity can be precisely reproduced on the photoresist coated on the wafer, whereby the desired pattern with a higher uniformity and fineness can be transferred on the photoresist.

In a photolithography method using the system shown in FIGS. 2 through 4, although the use of a plurality of reticles results in a higher resolution, during the passage through the reticles 23a and 23b and the projection lens 25, the optical path from the illumination source deviates from the desired ideal path. The deviation of the optical path causes a decrease in resolution. As a result, the pattern formed on the photoresist differs from the predetermined desired pattern.

Figure 5:
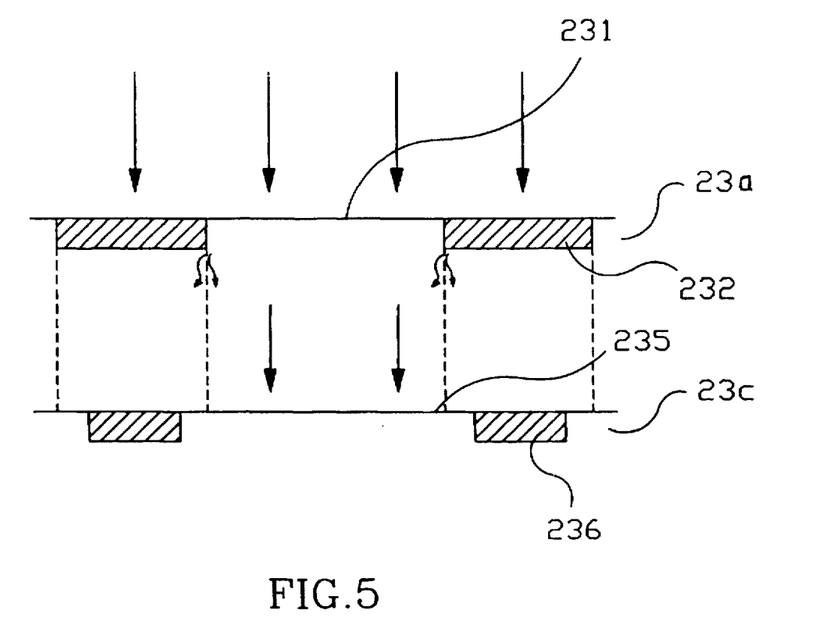
FIG. 5 shows a state of light while light passes through a plurality of reticles on which the pattern sizes, respectively, are different from each other, according to another embodiment of this invention.

Accordingly, another embodiment of this invention is shown in FIG. 5. The second embodiment is basically the same as the first embodiment shown in FIGS. 2 through 4, except that the mask patterns on the reticles are formed in a way that their sizes differ from each other. In other words, the opaque areas 232 and 236 on reticles 23a and 23c differ from each other in their sizes. In order to prevent a change of the optical path during the passage through the reticles 23a and 23c and through the projection lens(not shown), the patterns on the reticles are formed in different sizes to compensate for the light intensity, and hence the uniformity of exposure energy of the light is enhanced. In this regard, the opaque patterns 232 on the first reticle 23a of the reticles in the optical path from the illumination source have larger sizes than the opaque patterns 236 on the second reticle 23c which is disposed next to the first reticle 23a in the optical path. Moreover, the principle, by which the opaque patterns on the reticles differ in size as described above, is similarly applied to a case in which three or more reticles are used in the photolithography system.

Figure 6:
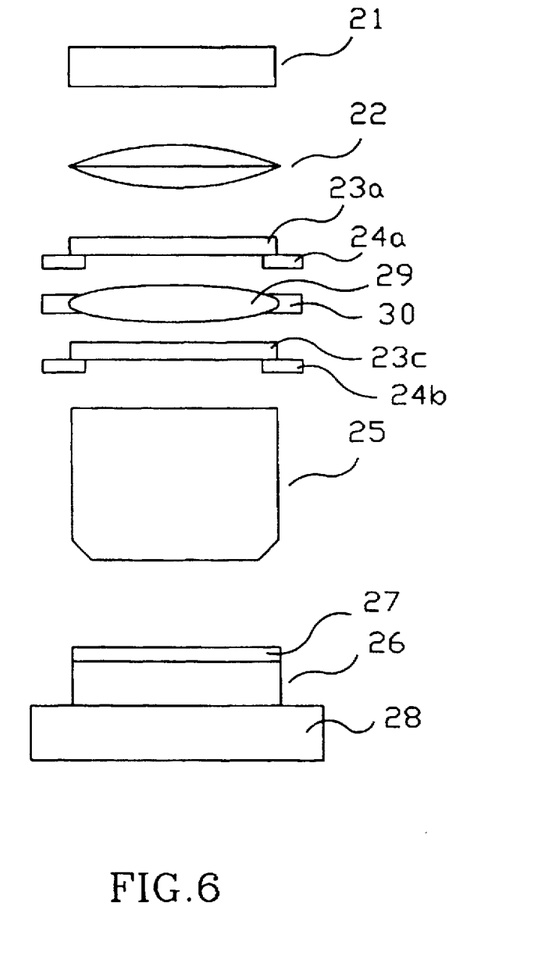
FIG. 6 is a drawing showing the schematical construction of a photolithography system for carrrying out a photolithography method, according to yet another embodiment of this invention.

FIG. 6 is an another embodiment of this invention for enhancing the resolution so as to transfer a uniform and fine pattern onto the photoresist. It is a modified embodiment of FIG. 2 to FIG. 5. In FIG. 6, the photolithography system is comprised of an illumination source 21, a plurality of reticles 23a and 23c, a condenser lens 29 contained between reticles 23a and 23c, a projection lens 25, a wafer 26, a photoresist 27 overlying the wafer 26, and a wafer supporting means 28. A plurality of reticles 23a and 23c are disposed between the light source 21 and the projection lens 25 such that the reticles are separated from each other along the optical path. The first reticle 23a and the second reticle 23c each has an integrated circuit mask pattern thereon and the mask patterns on the reticles are the same as, or fiffer from each other in their size. The reticles 23a and 23b are supported by reticle supports 24a and 24b, respectively. The condenser lens 29 is set between reticles 23a and 23c each having an intergrated circuit mask pattern. The condenser lens 29 is contained in the lens supporting member 30. The condenser lens may be disposed at one or more positions between the reticles when three or more reticles are used in the photolithograpy system.

Figure 7:
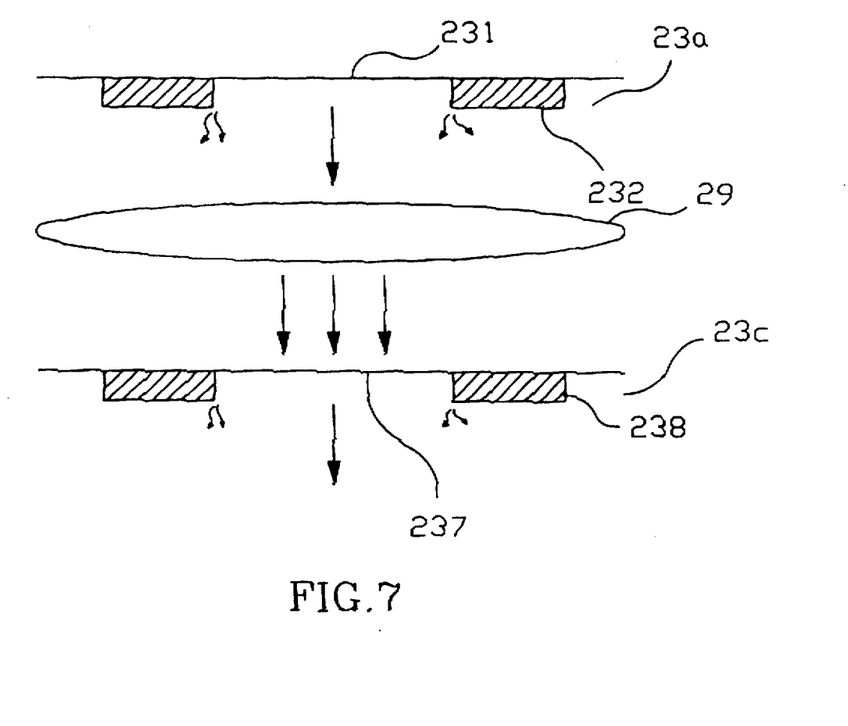
FIG. 7 is a schematical view showing the distribution state of energy intensity of light while light passes through a plurality of reticles by irradiating the light so as to carry out the photolithography method shown in FIG. 6.

As shown in FIGS. 6 and 7, in a photolithography system that includes the condenser lens 29 between a plurality of recticles, the light from the illumination source 21 is condensed by the condenser lens 22. The condensed light then passes through the first recticle 23a. At this time, about 99% of the condensed light is transmitted to the transparent area 231 on the first reticle 23a, while 1% or less of the condensed light is scattered at the edges of opaque area 232. The light transmitted through the first recticle 23a is again condensed by the condenser lens 29. The lens 29 improves straightness and uniformity(uniform density) of the transmitting light.

The light transmitted through the lens 29 again passes through a second reticle 23c, which has the same pattern in size and width as the first reticle 23a or has a smaller opaque pattern thereon than the first reticle 23a. At this time, in the same manner as a light transmission in the first reticle 23a, the incident light to the second reticle 23c is scattered at the edges of the opaque area 238. The scattered portion of the light is, however, weak in intensity because it is nearly filtered when passing through the lens 29 and the first reticle 23a. Therefore, the scattered portion of the light does not affect the image to be projected on the wafer. The above embodiment utilizes two reticles, but it is not limited to only two recticles. It is possible to apply a system including three or more reticles and two or more lens to this invention. In this case, the effect of enhancing the resolution is similarly obtained. In fact, in comparison with the former, this system will increase the resolution but using it will require an increase in the cost. Accordingly, both the resolution needed and the cost incurred must be considered in selecting the system with the approriate number of lens and an extent of the resolution.

As described above, by utilizing a plurality of reticles, this invention decreases the scattering of the light and increases the resolution. In addition, it increases the uniformity in energy of exposure to light by changing the size of each mask pattern in the multiple reticles, and increases the straightness and the uniformity of the light by inserting the condenser lens between the recticles because the light that is transmitted through the first reticle is condensed through the condenser lens.

Moreover, this invention increases the resolution but requires only a minimal modification. It does not require new investment in equipment and processes.

Accordingly, this invention makes it possible to fabricate sub-micro integrated circuits and high density devices that provide a large effect in terms of cost reduction.

The light exposure method of this invention is not defined to only a system using reticles, and it is naturally applied to the projection of mask patterns onto wafer using a plurality of masks.

Although several embodiments have been illustrated and described, it will be obivous those skilled in the art that various modifications may be made without departing from the spirit and scope of this invention.

What is claimed is:

1. A photolithography method for imaging a wafer in the production of integrated circuits, the method comprising:

(a) providing a plurality of reticles each comprising an integrated circuit mask pattern, wherein each of said reticles includes a transparent substrate and an opaque area on said transparent substrate, and said integrated circuit mask patterns on said plurality of reticles are the same with respect to the shape of said integrated circuit mask patterns;

(b) providing a projection stepper apparatus which is adapted to receive said reticles and is further adapted to project light through said reticles;

(c) inserting said reticles into said stepper apparatus such that said reticles are positioned separately from one another along an optical path; and (d) projecting light through said reticles to project said integrated circuit mask patterns of said reticles onto said wafer to form an image, wherein a scattered portion of light, generated while passing though one of said reticles in the optical path, is filtered out by a subsequent one of said reticles such that an image of said integrated circuit mask pattern is projected onto the wafer with high resolution.

2. The photolithography method for imaging a wafer in the production of integrated circuits as claimed in claim 1, wherein the size of each of said integrated circuit mask patterns on said reticles are different from each other.

3. The photolithography method for imaging a wafer in the production of integrated circuits as claimed in claim 2, wherein the size of said opaque area on said reticles decreases in size sequentially along the optical path with respect to said opaque area on a preceding one of said reticles.

4. The photolithography method for imaging a wafer in the production of integrated circuits as claimed in claim 1, wherein said plurality of reticles comprise two or more in number.

5. The photolithography method for imaging a wafer in the production of integrated circuits as claimed in claim 1, further comprising providing at least one condenser lens between two of said reticles disposed adjacent to each other, and providing a lens support structure adapted for holding said condenser lens between said adjacent reticles.

* * * * *